(12) United States Patent
Ito et al.

(10) Patent No.: US 10,742,169 B2
(45) Date of Patent: Aug. 11, 2020

(54) OSCILLATOR, ELECTRONIC APPARATUS, AND VEHICLE

(71) Applicant: SEIKO EPSON CORPORATION, Tokyo (JP)

(72) Inventors: Hisahiro Ito, Kamiina-gun (JP); Tetsuya Otsuki, Suwa-gun (JP); Shoichiro Kasahara, Kamiina-gun (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/199,846

(22) Filed: Nov. 26, 2018

(65) Prior Publication Data

US 2019/0165732 A1 May 30, 2019

(30) Foreign Application Priority Data

Nov. 27, 2017 (JP) .................... 2017-226674
Jun. 22, 2018 (JP) .................... 2018-118664

(51) Int. Cl.
| | | |
|---|---|---|
| H03B 5/32 | (2006.01) | |
| H03H 9/215 | (2006.01) | |
| H01L 23/495 | (2006.01) | |
| H03B 5/12 | (2006.01) | |
| H01L 23/00 | (2006.01) | |
| H03H 9/05 | (2006.01) | |
| H03L 7/099 | (2006.01) | |
| H03L 7/089 | (2006.01) | |

(52) U.S. Cl.
CPC ......... *H03B 5/32* (2013.01); *H01L 23/49596* (2013.01); *H01L 24/00* (2013.01); *H03B 5/1212* (2013.01); *H03B 5/1228* (2013.01); *H03B 5/1243* (2013.01); *H03H 9/0547* (2013.01); *H03H 9/215* (2013.01); *H01L 23/49541* (2013.01); *H03L 7/0891* (2013.01); *H03L 7/099* (2013.01)

(58) Field of Classification Search
CPC ........ H03B 5/32; H03H 9/0547; H03H 9/215; H01L 2224/4912; H01L 2224/33181
See application file for complete search history.

(56) References Cited

U.S. PATENT DOCUMENTS

| | | | |
|---|---|---|---|
| 2004/0155715 A1 | 8/2004 | Nakamura et al. | |
| 2013/0320514 A1* | 12/2013 | Romig | H01L 23/3107 257/675 |
| 2013/0335157 A1* | 12/2013 | Ishii | H01L 41/0475 331/158 |
| 2016/0285464 A1* | 9/2016 | Obata | H03L 1/04 |
| 2019/0109561 A1* | 4/2019 | Bahr | H03B 5/1296 |

FOREIGN PATENT DOCUMENTS

| | | |
|---|---|---|
| JP | 2004-15444 A | 1/2004 |
| JP | 2004-228895 A | 8/2004 |
| JP | 2010-10480 A | 1/2010 |
| JP | 2016-187153 A | 10/2016 |
| WO | 2009/157208 A1 | 12/2009 |

* cited by examiner

*Primary Examiner* — Jeffrey M Shin
(74) *Attorney, Agent, or Firm* — Oliff PLC (57) ABSTRACT

An oscillator includes a resonator and an integrated circuit element. The resonator includes a resonator element and a resonator element container accommodating the resonator element. The integrated circuit element includes an inductor. The resonator and the integrated circuit element are stacked on each other. The resonator includes a metal member, and the metal member does not overlap the inductor when viewed in a plan view.

20 Claims, 6 Drawing Sheets

OSCILLATOR, ELECTRONIC APPARATUS, AND VEHICLE

This application claims the benefit of priority from Japanese Patent Application No. 2017-226674 filed Nov. 27, 2017, and Japanese Patent Application No. 2018-118664 filed Jun. 22, 2018, the entire contents of the prior applications being incorporated herein by reference.

BACKGROUND

1. Technical Field

The present invention relates to an oscillator, an electronic apparatus, and a vehicle.

2. Related Art

Oscillators that oscillate resonators such as quartz crystal resonators and output signals having desired frequencies have been widely used in various electronic apparatuses and systems. In order to meet requests for miniaturization, an oscillator in which a resonator and an integrated circuit (IC) for oscillating the resonator are stacked is known. For example, JP-A-2010-10480 discloses a semiconductor module in which a quartz crystal resonator and a semiconductor element are stacked on a substrate. In this semiconductor module, an electronic component such as an inductor is mounted on a substrate as a body separate from the quartz crystal resonator and the semiconductor element.

However, in an oscillator in which a resonator and an IC are stacked, the inventor of this application has found that a new problem occurs in a case where a configuration in which an inductor is built into the IC is adopted for further miniaturization. That is, a magnetic field generated due to a current flowing into the inductor is blocked by a metal member constituting a portion of a quartz crystal resonator, and an eddy current is generated inside the metal member. As a result, it has been found that there is a concern that a Q value of the inductor is deteriorated and a function as a circuit element is deteriorated.

SUMMARY

An advantage of some aspects of the invention is to provide an oscillator capable of reducing a concern that a Q value of an inductor built into an integrated circuit element is deteriorated. In addition, an advantage of some aspects of the invention is also to provide an electronic apparatus and a vehicle which use the oscillator.

The invention can be implemented as the following forms or application examples.

Application Example 1

An oscillator according to this application example includes a resonator which includes a resonator element and a resonator element container accommodating the resonator element, and an integrated circuit element which includes an inductor, in which the resonator and the integrated circuit element are stacked on each other, the resonator includes a metal member, and the metal member does not overlap the inductor when viewed in a plan view.

In the oscillator according to this application example, the metal member included in the resonator does not overlap the inductor included in the integrated circuit element when viewed in a plan view, and thus a magnetic field generated due to a current flowing into the inductor is hardly blocked by the metal member included in the resonator, and an eddy current is hardly generated inside the metal member. Therefore, according to the oscillator of the application example, the deterioration of a Q value of the inductor is reduced, and a concern that a function as a circuit element is deteriorated is reduced.

Application Example 2

In the oscillator according to the application example, the integrated circuit element may further include a guard ring provided in a vicinity of the inductor, and the metal member may not overlap the guard ring when viewed in a plan view.

In the oscillator according to this application example, the metal member included in the resonator does not overlap the guard ring provided in the vicinity of the inductor when viewed in a plan view, and thus a distance between the metal member included in the resonator and the inductor is relatively large. Therefore, according to the oscillator of the application example, a magnetic field generated due to a current flowing into the inductor is hardly blocked by the metal member included in the resonator, and an eddy current is hardly generated inside the metal member. Therefore, the deterioration of a Q value of the inductor is reduced, and a concern that a function as a circuit element is deteriorated is reduced.

Application Example 3

In the oscillator according to the application example, the integrated circuit element may include a PLL circuit including the inductor and a filter, and the filter may overlap metal member when viewed in a plan view.

In the oscillator according to this application example, the filter hardly influenced by the metal member included in the resonator is disposed so as to overlap the resonator when viewed in a plan view, and thus a region overlapping the resonator is also effectively used. Therefore, according to the application example, an increase in the size of the area of the integrated circuit element is reduced, and the miniaturization of the oscillator is realized. Meanwhile, in the oscillator according to the application example, the entirety of the filter does not necessarily need to overlap the metal member, and a portion of the filter may overlap the metal member.

Application Example 4

In the oscillator according to the application example, the integrated circuit element may include an oscillation circuit which is connected to the resonator, and an output circuit which outputs a signal based on an oscillation signal output from the PLL circuit, the oscillation signal may be phase-synchronized with an output signal of the oscillation circuit, and the PLL circuit may be disposed between the oscillation circuit and the output circuit when viewed in a plan view.

In the oscillator according to this application example, the output signal of the oscillation circuit propagates to the PLL circuit, and an oscillation signal output from the PLL circuit propagates to the output circuit. Accordingly, the PLL circuit is disposed between the oscillation circuit and the output circuit so as to be matched to flows of various signals, and thus wirings through which the various signals propagate are shortened. Therefore, according to the oscillator of the application example, parasitic capacitance of each wiring is reduced, and noise superimposed on each signal due to crosstalk with other signals or the like is reduced.

Application Example 5

In the oscillator according to the application example, the integrated circuit element may include a first pad which is electrically connected to one end of the resonator, a second pad which is electrically connected to the other end of the resonator, and a third pad which is electrically connected to the output circuit, the first pad and the second pad may be provided along a first side of the integrated circuit element, and the third pad may be provided along a second side facing the first side of the integrated circuit element.

In the oscillator according to this application example, a signal input to the integrated circuit element through the first pad or the second pad provided along the first side from the resonator propagates toward the second side from the first side, and is output through the third pad provided along the second side. For this reason, in the integrated circuit element, it is easy to dispose the circuits so that various signals flow in substantially one direction toward the second side from the first side, and various wirings through which the various signals propagate are shortened. Therefore, according to the oscillator of the application example, parasitic capacitance of each wiring is reduced, and noise superimposed on each signal due to crosstalk with other signals or the like is reduced.

Application Example 6

In the oscillator according to the application example, the resonator element container may include a base which is provided with a concave portion accommodating the resonator element, and a lid which is the metal member, and the resonator may be mounted on the integrated circuit element so that the lid faces the integrated circuit element.

In the oscillator according to this application example, the lid of the resonator element container does not overlap the inductor when viewed in a plan view, and thus a magnetic field generated due to a current flowing into the inductor is hardly blocked by the lid which is a metal member, and an eddy current is hardly generated inside the lid. Therefore, according to the oscillator of the application example, the deterioration of a Q value of the inductor is reduced, and a concern that a function as a circuit element is deteriorated is reduced.

In addition, according to the oscillator of this application example, it is possible to connect the electrode provided on the outer surface of the base of the resonator element container and the electrode provided in the integrated circuit element by wire bonding, and thus it is easy to mount the oscillator.

Application Example 7

In the oscillator according to the application example, the metal member may be an electrode provided in the resonator element.

In the oscillator according to this application example, the electrode provided in the resonator element does not overlap the inductor when viewed in a plan view, and thus a magnetic field generated due to a current flowing into the inductor is hardly blocked by the electrode provided in the resonator element, and an eddy current is hardly generated inside the electrode. Therefore, according to the oscillator of the application example, the deterioration of a Q value of the inductor is reduced, and a concern that a function as a circuit element is deteriorated is reduced.

Application Example 8

In the oscillator according to the application example, a first electrode, a second electrode, a third electrode, and a fourth electrode may be provided at four corners on an outer surface of the resonator element container, the first electrode and the third electrode may be provided at two corners on a diagonal of the outer surface, the second electrode and the fourth electrode may be provided at the other two corners on a diagonal of the outer surface, and the third electrode may extend between the first electrode and the second electrode.

In the oscillator according to this application example, the third electrode extends between the first electrode and the second electrode on the outer surface of the resonator element container, and thus two bonding wires connecting two terminals for connecting the first electrode and the third electrode and the resonator provided at a predetermined side of the integrated circuit element are shortened, thereby lowering the wires. Therefore, according to the oscillator of the application example, a concern that some of the wires are exposed to the outside of the mold resin is reduced in a sealing process of the resonator and the integrated circuit element.

Meanwhile, many types of resonators are configured such that terminals are provided at four corners and have similar appearances in order to meet demands for compatibility. Accordingly, in a case where different types of resonators are mixed in a resonator group to be manufactured in a manufacturing process, it is difficult to distinguish between the resonators by their appearances, and a situation where distinction is first made in an inspection process may occur. On the other hand, in the oscillator according to this application example, demands for compatibility are met because the four electrodes are provided at four corners on the outer surface of the resonator element container, and it is possible to distinguish the resonator from other resonators by appearance because the third electrode has a characteristic shape greatly different from those of other types of resonators.

Application Example 9

An oscillator according to this application example includes a resonator which includes a resonator element and a resonator element container accommodating the resonator element, and an integrated circuit element, in which the resonator and the integrated circuit element may be stacked on each other, the integrated circuit element may include an oscillation circuit which is connected to the resonator, a first PLL circuit which includes a first inductor, and a second PLL circuit which includes a second inductor, a first oscillation signal output from the first PLL circuit and a second oscillation signal output from the second PLL circuit may be phase-synchronized with an output signal of the oscillation circuit, the resonator may include a metal member, and the metal member may not overlap the first inductor and the second inductor when viewed in a plan view.

In the oscillator according to this application example, the metal member included in the resonator does not overlap the first inductor included in the first PLL circuit and the second inductor included in the second PLL circuit when viewed in a plan view, and thus a magnetic field generated due to a current flowing into the first inductor and a magnetic field generated due to a current flowing into the second inductor are hardly blocked by the metal member included in the resonator, and an eddy current is hardly generated inside the metal member. Therefore, according to the oscillator of the application example, the deterioration of Q values of the first inductor and the second inductor is reduced, and a concern that a function as a circuit element is deteriorated is reduced.

Application Example 10

An electronic apparatus according to this application example includes any one of the above-described oscillators.

Application Example 11

A vehicle according to this application example includes any one of the above-described oscillators.

According to these application examples, it is possible to implement the electronic apparatus and the vehicle including the oscillator which is capable of reducing a concern that a Q value of the inductor built into the integrated circuit element is deteriorated and having higher reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred exemplary embodiment of the invention will be described in detail with reference to the accompanying drawings. Meanwhile, the exemplary embodiment to be described below does not unduly limit the contents of the invention described in the appended claims. In addition, all configurations to be described below are not limited to being essential constituent conditions of the invention.

1. Oscillator 1-1. Functional Configuration of Oscillator

Figure 1:
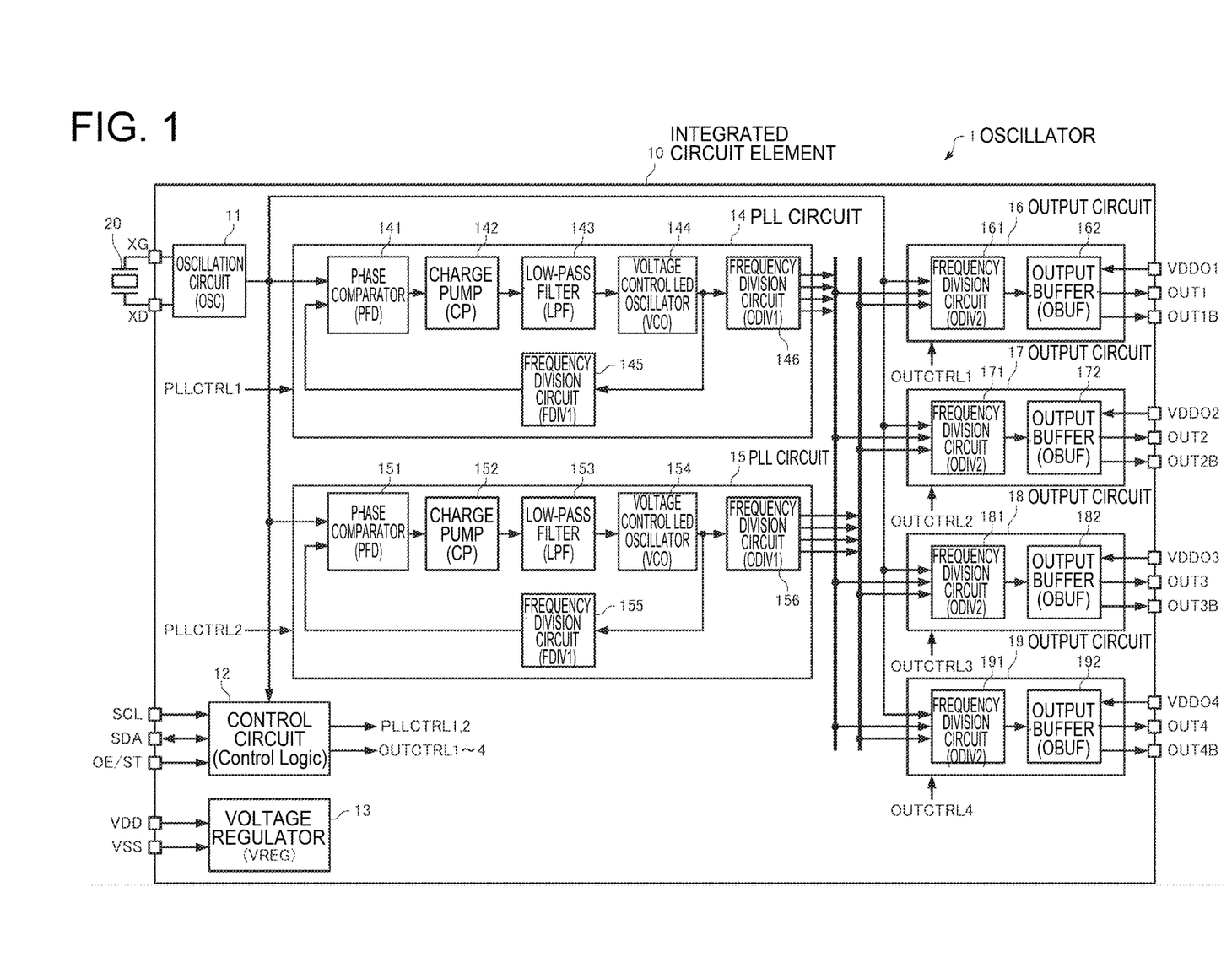
FIG. 1 is a functional block diagram of an oscillator of this exemplary embodiment.

FIG. 1 is a functional block diagram of an oscillator 1 of this exemplary embodiment. As illustrated in FIG. 1, the oscillator 1 of this exemplary embodiment is configured to include an integrated circuit element 10 and a resonator 20.

As the resonator 20, for example, a quartz crystal resonator, a Surface Acoustic Wave (SAW) resonant element, other piezoelectric resonant elements, a Micro Electro Mechanical Systems (MEMS) resonator, and the like can be used.

In this exemplary embodiment, the integrated circuit element 10 is configured as an integrated circuit (IC) of one chip, and includes an oscillation circuit 11 (OSC), a control circuit 12 (Control Logic), a voltage regulator 13 (VREG), two PLL circuits 14 and 15, and four output circuits 16, 17, 18, and 19. Meanwhile, the integrated circuit element 10 may be configured such that some of these components are omitted or changed, or other components are added.

The voltage regulator 13 generates a predetermined voltage with a ground voltage (0 V) supplied through a VSS terminal as a reference, on the basis of a power voltage supplied through a VDD terminal. The voltage generated by the voltage regulator 13 serves as power voltages of the oscillation circuit 11 and the two PLL circuits 14 and 15.

The oscillation circuit 11 is connected to one end (an electrode 26a (see FIG. 5)) of the resonator 20 through an XG terminal and is connected to the other end (an electrode 26c (see FIG. 5)) of the resonator 20 through an XD terminal. The oscillation circuit 11 oscillates the resonator 20 by amplifying an output signal of the resonator 20 which is input through the XG terminal and feeding back the amplified signal to the resonator 20 through the XD terminal. For example, the oscillation circuit constituted by the resonator 20 and the oscillation circuit 11 may be any of various types of oscillation circuits such as a pierced oscillation circuit, an inverter-type oscillation circuit, a Colpitts oscillation circuit, and a Hartley oscillation circuit.

The PLL circuit 14 (an example of "a first PLL circuit") is phase-synchronized with an oscillation signal output from the oscillation circuit 11, generates an oscillation signal (an example of "a first oscillation signal") obtained by multiplying and dividing the frequency of the oscillation signal, and outputs the generated oscillation signal. Similarly, the PLL circuit 15 (an example of "a second PLL circuit") is phase-synchronized with an oscillation signal output from the oscillation circuit 11, generates an oscillation signal (an example of "a second oscillation signal") obtained by multiplying and dividing the frequency of the oscillation signal, and outputs the generated oscillation signal. The number of times of multiplication and a frequency division ratio of the PLL circuit 14 are set in accordance with a control signal PLLCTRL1, and the number of times of multiplication and a frequency division ratio of the PLL circuit 15 are set in accordance with a control signal PLLCTRL2.

In this exemplary embodiment, the two PLL circuits 14 and 15 are fractional N-PLL circuits. Specifically, the PLL circuit 14 is configured to include a phase comparator 141 (PFD), a charge pump 142 (CP), a low-pass filter 143 (LPF), a voltage controlled oscillator 144 (VCO), a frequency division circuit 145 (FDIV1), and a frequency division circuit 146 (ODIV1).

The phase comparator 141 compares a phase difference between an oscillation signal output by the oscillation circuit 11 and an oscillation signal output by the frequency division circuit 145, and outputs a comparison result as a pulse voltage.

The charge pump 142 converts a pulse voltage output by the phase comparator 141 into a current, and the low-pass filter 143 smoothens the current output by the charge pump 142 and converts the smoothened current into a voltage.

The voltage controlled oscillator 144 outputs an oscillation signal of which the frequency changes depending on an output voltage of the low-pass filter 143. In this exemplary embodiment, the voltage controlled oscillator 144 is realized by an LC oscillation circuit constituted using an inductor and a variable capacity element.

The frequency division circuit 145 outputs an oscillation signal, obtained by performing integer frequency division on an oscillation signal output by the voltage controlled oscillator 144, at a frequency division ratio (integer frequency division ratio) which is set in accordance with the control signal PLLCTRL1. In this exemplary embodiment, a frequency division ratio (integer frequency division ratio) of the frequency division circuit 145 changes to a plurality of integer values in a range around an integer value N in time series, and a time average value thereof is N+F/M. Therefore, in a normal state where the phase of an oscillation signal output from the oscillation circuit 11 and the phase of an oscillation signal output from the frequency division circuit 145 are synchronized with each other, a frequency $f_{vco}$ of the oscillation signal output from the voltage controlled oscillator 144 and a frequency $f_{osc}$ of the oscillation signal output from the oscillation circuit 11 satisfy a relationship of Expression (1).

$$f_{VCO} = \left(N + \frac{F}{M}\right) \times f_{OSC} \quad (1)$$

The frequency division circuit 146 outputs an oscillation signal, obtained by performing integer frequency division on the oscillation signal output by the voltage controlled oscillator 144, at a frequency division ratio which is set in accordance with the control signal PLLCTRL1. In this exemplary embodiment, the frequency division circuit 146 outputs four types of oscillation signals. Frequencies of these four types of oscillation signals are determined by four types of frequency division ratios which are set in accordance with the control signal PLLCTRL1.

Similarly to the PLL circuit 14, the PLL circuit 15 is configured to include a phase comparator 151 (PFD), a charge pump 152 (CP), a low-pass filter 153 (LPF), a voltage controlled oscillator 154 (VCO), a frequency division circuit 155 (FDIV1), and a frequency division circuit 156 (ODIV1). The configuration of the PLL circuit 15 is the same as that of the PLL circuit 14, and thus a description thereof will not be repeated.

The four output circuits 16, 17, 18, and 19 output a signal based on oscillation signals output from the two PLL circuits 14 and 15. Specifically, an oscillation signal output from the oscillation circuit 11 is input to the four output circuits 16, 17, 18, and 19 in common, and one oscillation signal among the four types of oscillation signals output from the PLL circuit 14 (frequency division circuit 146) and one oscillation signal among the four types of oscillation signals output from the PLL circuit 15 (frequency division circuit 156) are input to the four output circuits 16, 17, 18, and 19. The four output circuits 16, 17, 18, and 19 generate an oscillation signal obtained by performing frequency-division on one oscillation signal selected from the input three types of oscillation signals, and outputs the generated oscillation signal in a selected output format. The selection of an oscillation signal and an output format and the setting of a frequency division ratio on the output circuits 16, 17, 18, and 19 are performed in accordance with the control signals OUTCTRL1, OUTCTRL2, OUTCTRL3, and OUTCTRL4.

In this exemplary embodiment, the output circuit 16 is configured to include a frequency division circuit 161 (ODIV2) and an output buffer 162 (OBUF).

The frequency division circuit 161 selects any one of the oscillation signal output from the oscillation circuit 11, the oscillation signal output from the PLL circuit 14 (frequency division circuit 146), and the oscillation signal output from the PLL circuit 15 (frequency division circuit 156) in accordance with the control signal OUTCTRL1, and output an oscillation signal obtained by performing frequency-division on the selected oscillation signal at a frequency division ratio set in accordance with the control signal OUTCTRL1.

The output buffer 162 converts the oscillation signal output from the frequency division circuit 161 into an oscillation signal in an output format selected in accordance with the control signal OUTCTRL1, on the basis of a power voltage supplied through a VDDO1 terminal, and outputs the converted oscillation signal to the outside (the outside of the oscillator 1) of the integrated circuit element 10 through at least one of an OUT1 terminal and an OUT1B terminal. For example, the output buffer 162 outputs a differential oscillation signal through the OUT1 terminal and the OUT1B terminal in a case where a differential output such as a Positive Emitter Coupled Logic (PECL) output, a Low Voltage Differential Signaling (LVDS) output, or a High-Speed Current Steering Logic (HCSL) output is selected, and outputs a single-ended oscillation signal through the OUT1 terminal or the OUT1B terminal in a case where a single-ended output such as a Complementary Metal Oxide Semiconductor (CMOS) output is selected as an output format. Meanwhile, the output of an oscillation signal or the stop of output of an oscillation signal by the output buffer 162 is controlled in accordance with the control signal OUTCTRL1.

Similarly to the output circuit 16, the output circuit 17 is configured to include a frequency division circuit 171 (ODIV2) and an output buffer 172 (OBUF), generates an oscillation signal in an output format selected in accordance with the control signal OUTCTRL2 on the basis of a power voltage supplied through a VDDO2 terminal, and outputs the generated oscillation signal to the outside (the outside of the oscillator 1) of the integrated circuit element 10 through at least one of the OUT2 terminal and the OUT2B terminal. Similarly, the output circuit 18 is configured to include a frequency division circuit 181 (ODIV2) and an output buffer 182 (OBUF), generates an oscillation signal in an output format selected in accordance with the control signal OUTCTRL3 on the basis of a power voltage supplied through a VDDO3 terminal, and outputs the generated oscillation signal to the outside (the outside of the oscillator 1) of the integrated circuit element 10 through at least one of an OUT3 terminal and an OUT3B terminal. Similarly, the output circuit 19 is configured to include a frequency division circuit 191 (ODIV2) and an output buffer 192 (OBUF), generates an oscillation signal in an output format selected in accordance with a control signal OUTCTRL4 on the basis of a power voltage supplied through a VDDO4 terminal, and outputs the generated oscillation signal to the outside (the outside of the oscillator 1) of the integrated circuit element 10 through at least one of the OUT4 terminal and the OUT4B terminal. Configurations of the output circuits 17, 18, and 19 are the same as that of the output circuit 16, and thus a description thereof will not be repeated.

The control circuit 12 generates the above-described control signals PLLCTRL1, PLLCTRL2, OUTCTRL1, OUTCTRL2, OUTCTRL3, and OUTCTRL4. Specifically, the control circuit includes an interface circuit corresponding to an Inter-Integrated Circuit (I²C) bus and a storage circuit (for example, a register) (both are not shown in the drawing), receives a serial data signal input through a SDA terminal in synchronization with a serial clock signal input through a SCL terminal from an external device not shown in the drawing, and stores various pieces of data in the storage circuit in accordance with the received serial data. The control circuit 12 generates each control signal on the basis of various pieces of data stored in the storage circuit. Meanwhile, the interface circuit included in the control circuit 12 is not limited to an interface circuit corresponding to an I²C bus, and may be, for example, an interface circuit corresponding to a Serial Peripheral Interface (SPI) bus.

Figure 2:
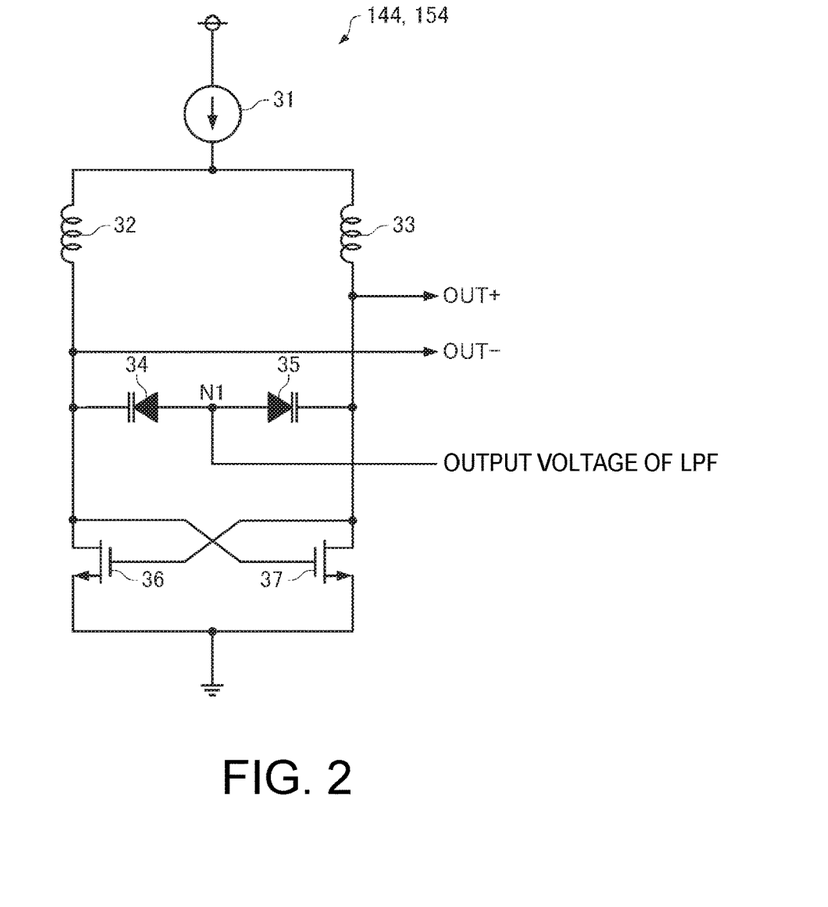
FIG. 2 is a diagram illustrating a configuration example of voltage controlled oscillators.

FIG. 2 is a diagram illustrating a configuration example of the voltage controlled oscillators 144 and 154. The voltage controlled oscillators 144 and 154 illustrated in FIG. 2 is configured to include a current source 31, inductors 32 and 33, variable capacity diodes (varactors) 34 and 35 which are variable capacity elements, and N-channel type MOS transistors 36 and 37, and outputs oscillation signals (for example, differential signals OUT+ and OUT−) generated by an oscillation stage constituted by the N-channel type MOS transistors 36 and 37. An output voltage of the low-pass filter 143 or the low-pass filter 153 is applied to a node N1 to which the anode of the variable capacity diode 34 and the anode of the variable capacity diode 35 are connected, and capacitance values of the variable capacity diodes 34 and 35 change depending on a voltage of the node N1. The frequencies of oscillation signals output from the voltage controlled oscillators 144 and 154 are determined in accordance with inductance values of the inductors 32 and 33 and the capacitance values of the variable capacity diodes 34 and 35.

The oscillator 1 according to this exemplary embodiment which is configured as described above and usable as a clock signal generation device (clock generator) generates oscillation signals having a plurality of types of frequencies according to setting on the basis of an oscillation signal output from the resonator 20 and outputs the generated oscillation signals.

1-2. Structure of Oscillator

Figure 3:
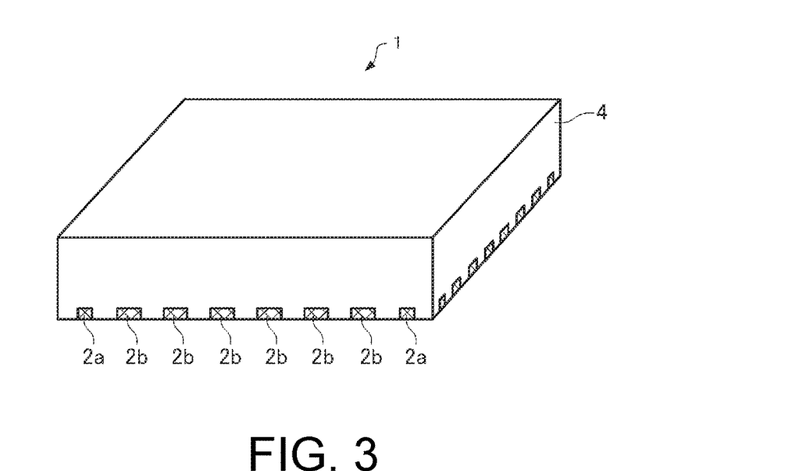
FIG. 3 is a perspective view of the oscillator of this exemplary embodiment.
Figure 4:
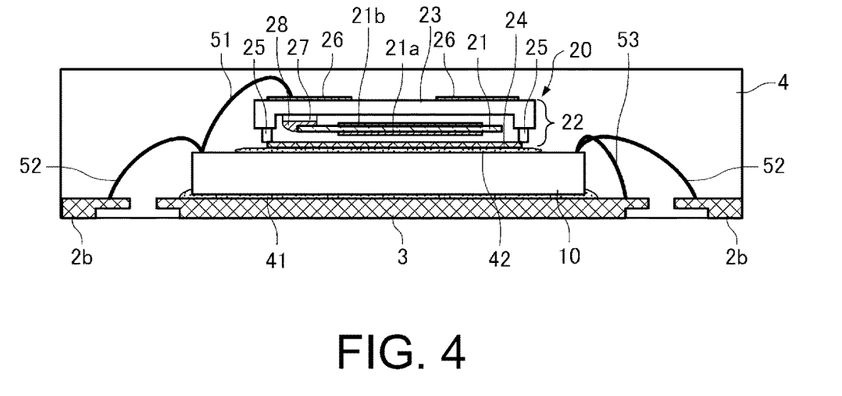
FIG. 4 is a side view of the oscillator of this exemplary embodiment.
Figure 5:
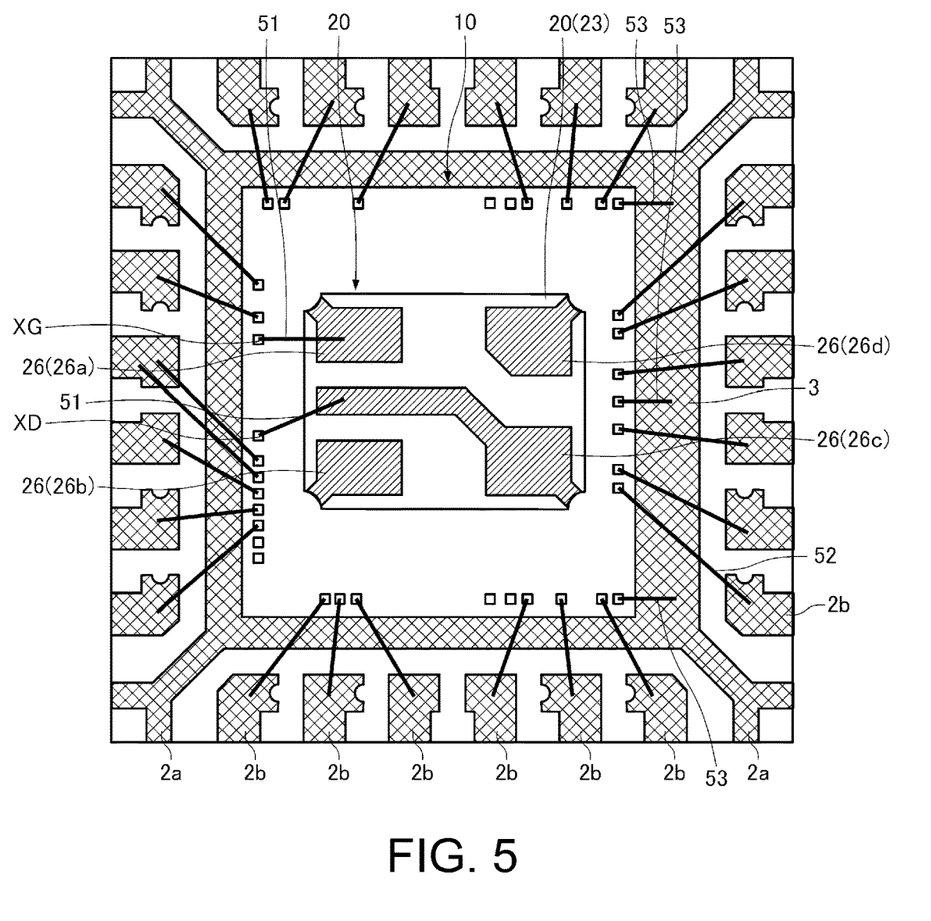
FIG. 5 is a plan view when the oscillator of this exemplary embodiment is viewed from above.

FIGS. 3 to 5 are diagrams illustrating an example of the structure of the oscillator 1 of this exemplary embodiment. FIG. 3 is a perspective view of the oscillator 1, FIG. 4 is a side view of the oscillator 1, and FIG. 5 is a plan view when the oscillator 1 is viewed from above. FIG. 4 is a side view when viewed from the bottom of FIG. 5, and is shown in a state of seeing through a mold resin 4, the container of the resonator 20, and the like for the sake of convenience. In addition, FIG. 5 is shown in a state where the mold resin 4 is not present.

As illustrated in FIGS. 3 and 4, the oscillator 1 of this exemplary embodiment has a structure (for example, a Quad Flat Non lead package (QFN) package structure) in which the integrated circuit element 10 and the resonator 20 are sealed by the mold resin 4, and is formed into a low rectangular parallelepiped as a whole. Metal electrodes 2a are respectively provided in both end portions on the bottom side on each side surface of the oscillator 1, and a plurality of metal electrodes 2b are provided between two electrodes 2a at substantially equal intervals. The electrodes 2a and 2b are also exposed to peripheral portions of the bottom surface of the oscillator 1.

As illustrated in FIGS. 4 and 5, the integrated circuit element 10 is mounted on a metal stand 3, and the integrated circuit element 10 and the stand 3 are firmly fixed to each other by an adhesive 41. The bottom surface of the stand 3 is exposed to the bottom surface of the oscillator 1. The stand 3 extends to four corners of the oscillator 1, and the stand 3 and the electrodes 2a are integrally formed. The stand 3 and the electrodes 2a are, for example, grounded.

As illustrated in FIG. 4, the resonator 20 includes a resonator element 21 and a resonator element container 22 accommodating the resonator element 21. The resonator element container 22 includes a base 23 provided with a concave portion in which the resonator element 21 is accommodated, a lid 24 which is a metal member, and a seaming ring 25 for bonding the base 23 and the lid 24 to each other. The member of the base 23 is, for example, ceramics. The member of the lid 24 is, for example, Kovar (an alloy including steel mixed with nickel and cobalt).

The resonator element 21 is a member having a thin plate shape, and has metal excitation electrodes 21a and 21b respectively provided on both surfaces thereof. The resonator element 21 is firmly fixed to a metal electrode 27 provided in the base 23 by a conductive adhesive 28, and oscillates at a desired frequency based on the shape and mass of the resonator element 21 including the excitation electrodes 21a and 21b. As a material of the resonator element 21, a piezoelectric material, for example, piezoelectric single crystals such as quartz crystal, lithium tantalate, and lithium niobate, or piezoelectric ceramics such as lead zirconate titanate, a silicon semiconductor material, or the like can be used. In addition, as excitation means of the resonator element 21, excitation means using a piezoelectric effect may be used, or electrostatic driving using a Coulomb force may be used.

As illustrated in FIGS. 4 and 5, the resonator 20 is mounted on the upper surface of the integrated circuit element 10, and the lid 24 of the resonator 20 and the integrated circuit element 10 are firmly fixed to each other by an adhesive 42. That is, the resonator 20 is mounted on the integrated circuit element 10 so that the lid 24 faces the integrated circuit element 10.

As illustrated in FIG. 5, four electrodes 26, that is, an electrode 26a (an example of "a first electrode"), an electrode 26b (an example of "a second electrode"), an electrode 26c (an example of "a third electrode"), and an electrode 26d (an example of "a fourth electrode") are provided at four corners on the outer surface (the outer surface of the base 23) of the resonator element container 22 of the resonator 20. The electrode 26a and the electrode 26c are provided at two corners on a diagonal of the outer surface (the outer surface of the base 23) of the resonator element container 22, and the electrode 26b and the electrode 26d are provided at the other two corners on a diagonal of the outer surface (the outer surface of the base 23) of the resonator element container 22. The electrodes 26a and 26c are electrically connected to the excitation electrodes 21a and 21b of the resonator element 21 by wirings not shown in the drawing and provided in the base 23. In addition, the electrodes 26b and 26d are electrically connected to the lid 24 by wirings not shown in the drawing and provided in the base 23.

The electrode 26a is bonded to a pad functioning as an XG terminal provided on the upper surface of the integrated circuit element 10 by a wire 51 made of gold or the like. The electrode 26c extends between the electrode 26a and the electrode 26b, and is bonded to a pad functioning as an XD terminal provided on the upper surface of the integrated circuit element 10 by another wire 51 at an extended end. Thereby, the wire 51 is successfully shortened. Meanwhile, the electrodes 26b and 26d are in an electrically floating state in FIG. 5, but may be grounded.

Some of the pads provided on the upper surface of the integrated circuit element 10 are respectively bonded to the electrodes 2b by wires 52 made of gold or the like. In addition, the other pads (pads functioning as VSS terminals) provided on the upper surface of the integrated circuit element 10 are bonded to the stand 3 by wires 53 made of gold or the like.

In this manner, the oscillator 1 of this exemplary embodiment is configured such that the resonator 20 and the integrated circuit element 10 are stacked, so that miniaturization is realized. Further, in the oscillator 1 of this exemplary embodiment, the wire 51 is shortened by the electrode 26c extending between the electrode 26a and the electrode 26b, and thus it is possible to lower the wire 51. Thereby, a concern that some of the wires 51 are exposed to the outside of the mold resin 4 is reduced in a sealing process of the resonator 20 and the integrated circuit element 10.

Meanwhile, many types of resonators are configured such that terminals are provided at four corners and have similar appearances in order to meet demands for compatibility. Accordingly, in a case where different types of resonators are mixed in a resonator group to be manufactured in a manufacturing process, it is difficult to distinguish between the resonators by their appearances, and a situation where distinction is first made in an inspection process may occur. On the other hand, in the oscillator 1 of this exemplary embodiment, demands for compatibility are met because the four electrodes 26a to 26d are provided at four corners in the resonator 20, and it is possible to distinguish the resonator 20 from other resonators by appearance because the electrode 26c has a characteristic shape greatly different from those of other types of resonators.

1-3. Internal Arrangement of Integrated Circuit Element

Figure 6:
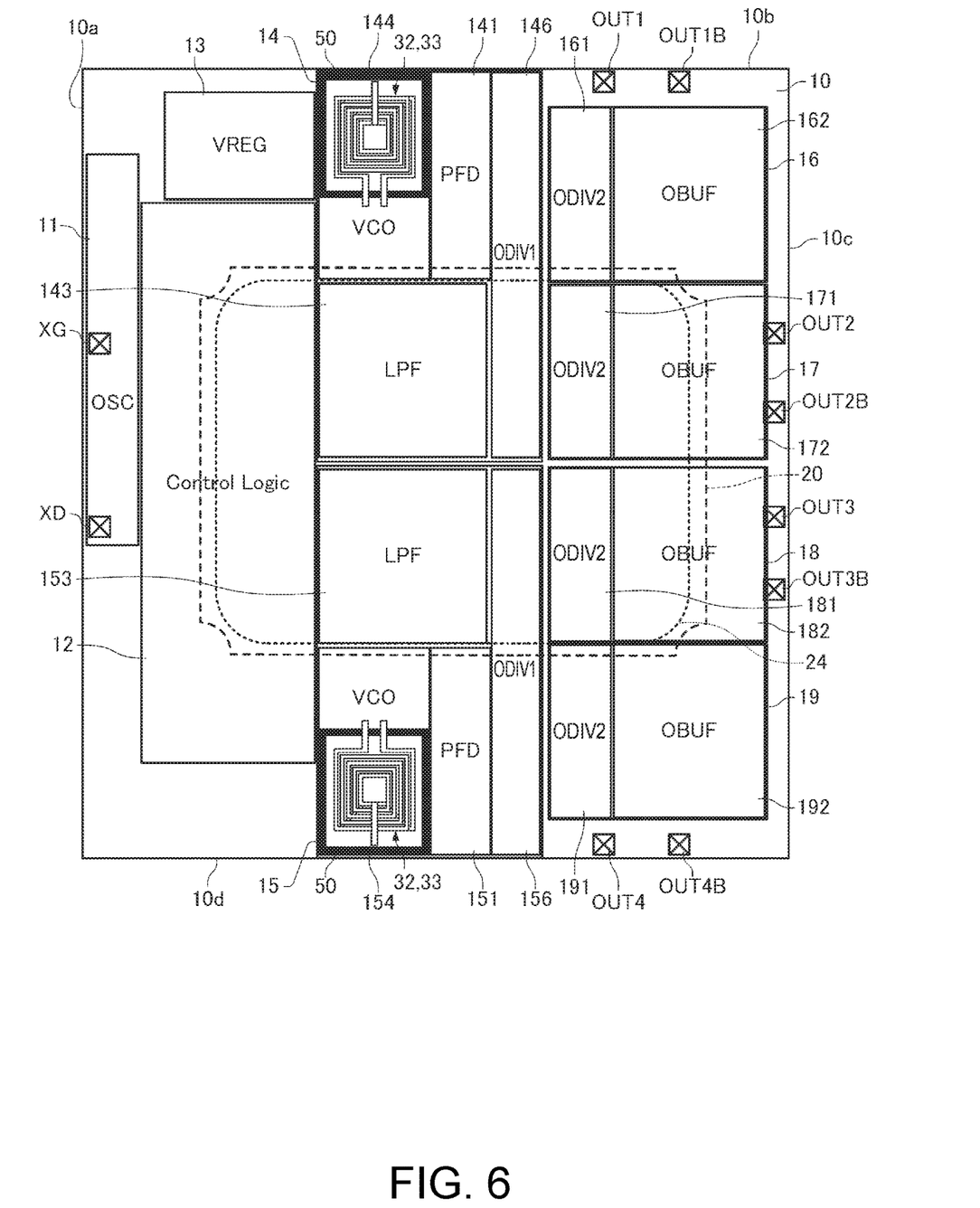
FIG. 6 is a diagram illustrating an example of the internal arrangement of an integrated circuit element.

FIG. 6 is a diagram illustrating an example of the internal arrangement of the integrated circuit element 10, and is a plan view of the integrated circuit element 10 when the oscillator 1 is viewed from the same direction as FIG. 5. FIG. 6 illustrates the arrangement of circuits (see FIG. 1) included in the integrated circuit element 10 and pads functioning as some terminals.

As illustrated in FIG. 6, the integrated circuit element 10 has a rectangular shape including four sides 10a, 10b, 10c, and 10d when viewed in a plan view.

The oscillation circuit 11 is disposed in the vicinity of the side 10a of the integrated circuit element 10 when viewed in a plan view of the oscillator 1 (when viewed in a plan view of the integrated circuit element 10). A pad (an example of "a first pad") functioning as an XG terminal and electrically connected to the electrode 26a of the resonator 20 is provided along the side 10a (an example of "a first side") of the integrated circuit element 10. Similarly, a pad (an example of "a second pad") functioning as an XD terminal and electrically connected to the electrode 26b of the resonator 20 is provided along the side 10a of the integrated circuit element 10. Therefore, according to the oscillator 1 of this exemplary embodiment, an oscillation signal generated on the basis of a signal input from the XG terminal in the oscillation circuit 11 propagates through a short wiring and is output from the XD terminal, and is thus unlikely to be influenced by noise.

The voltage regulator 13 is disposed between the oscillation circuit 11 and the PLL circuit 14 when viewed in a plan view of the oscillator 1 (when viewed in a plan view of the integrated circuit element 10). In addition, the control circuit 12 is disposed between the oscillation circuit 11 and the PLL circuit 14 (the phase comparator 141, the charge pump 142, the low-pass filter 143, the voltage controlled oscillator 144, the frequency division circuit 145, and the frequency division circuit 146) or the PLL circuit 15 (the phase comparator 151, the charge pump 152, the low-pass filter 153, the voltage controlled oscillator 154, the frequency division circuit 155, and the frequency division circuit 156).

In addition, the PLL circuit 14 is disposed between the oscillation circuit 11 and the output circuit 16 (the frequency division circuit 161 and the output buffer 162) or the output circuit 17 (the frequency division circuit 171 and the output buffer 172) when viewed in a plan view of the oscillator 1 (when viewed in a plan view of the integrated circuit element 10). Similarly, the PLL circuit 15 is disposed between the oscillation circuit 11 and the output circuit 18 (the frequency division circuit 181 and the output buffer 182) or the output circuit 19 (the frequency division circuit 191 and the output buffer 192) when viewed in a plan view of the oscillator 1 (when viewed in a plan view of the integrated circuit element 10).

In addition, the output circuit 16, the output circuit 17, the output circuit 18, and the output circuit 19 are disposed in a row toward the side 10d facing (i.e., opposite) the side 10b from the side 10b in the vicinity of the side 10c facing (i.e., opposite) the side 10a of the integrated circuit element 10 when viewed in a plan view of the oscillator 1 (when viewed in a plan view of the integrated circuit element 10). A pad functioning as the OUT1 terminal or the OUT1B terminal and electrically connected to the output circuit 16 is provided on a side close to the side 10c along the side 10b. In addition, a pad (another example of "a third pad") functioning as the OUT2 terminal or the OUT2B terminal and electrically connected to the output circuit 17 is provided along the side 10c (an example of "a second side"). Similarly, a pad (another example of "a third pad") functioning as the OUT3 terminal or the OUT3B terminal and electrically connected to the output circuit 18 is provided along the side 10c. In addition, a pad functioning as the OUT4 terminal or the OUT4B terminal and electrically connected to the output circuit 19 is provided on a side close to the side 10c along the side 10d.

Here, an oscillation signal generated by the oscillation circuit 11 propagates to the PLL circuits 14 and 15 and propagates to the output circuits 16 to 19, and a signal based on the oscillation signal is output from the OUT1 to OUT4 terminals and the OUT1B to OUTB terminals. Therefore, in the oscillator 1 of this exemplary embodiment, the circuits and the pads are disposed so as to be matched to a flow of such a signal as illustrated in FIG. 6, so that various signals flow in substantially one direction toward the side 10b from the side 10a and wirings through which the various signals propagate are shortened. Accordingly, noise superimposed on each signal due to crosstalk with other signals or the like is reduced. Further, each wiring is shortened, and thus a wiring region becomes smaller as a whole, and thus the area of the integrated circuit element 10 is reduced.

Further, in this exemplary embodiment, the inductors 32 and 33 (an example of "a first inductor") included in the voltage controlled oscillator 144 of the PLL circuit 14 are provided in the vicinity of the side 10b, and the inductors 32 and 33 (an example of "a second inductor") included in the voltage controlled oscillator 154 of the PLL circuit 15 are provided in the vicinity of the side 10d. Thereby, a wide region is formed between the inductors 32 and 33 included in the voltage controlled oscillator 144 and the inductors 32 and 33 included in the voltage controlled oscillator 154. As indicated by a dashed line in FIG. 6, the resonator 20 overlaps the region and does not overlap the inductors 32 and 33 when viewed in a plan view of the oscillator 1. Therefore, metal members included in the resonator 20, that is, the lid 24 and the electrodes (excitation electrodes 21*a* and 21*b*) provided in the resonator element 21 do not overlap the inductors 32 and 33. Further, as illustrated in FIG. 6, a guard ring 50 having a fixed voltage (for example, a ground voltage (0 V)) is provided in the vicinity of the inductors 32 and 33, and metal members (the lid 24 and the excitation electrodes 21*a* and 21*b*) included in the resonator 20 do not also overlap the guard ring 50.

Therefore, according to the oscillator 1 of this exemplary embodiment, a magnetic field generated due to a current flowing into the inductors 32 and 33 is hardly blocked by the metal members included in the resonator 20 (in particular, the lid 24 and the excitation electrodes 21*a* and 21*b* which are planar metal members facing the integrated circuit element 10), and an eddy current is hardly generated inside the metal members. As a result, the deterioration of Q values of the inductors 32 and 33 is reduced, and a concern that a function as a circuit element is deteriorated is reduced.

On the other hand, the low-pass filters 143 and 153 are constituted by, for example, a resistor and a capacitor. Accordingly, the low-pass filters do not include an inductor, and thus deterioration in the characteristics thereof due to the metal members included in the resonator 20 hardly occurs. Consequently, in this exemplary embodiment, the low-pass filters 143 and 153 partially overlap the metal members (the lid 24 and the excitation electrodes 21*a* and 21*b*) included in the resonator 20. In this manner, in the oscillator 1 of this exemplary embodiment, a circuit hardly influenced by the metal members included in the resonator 20 is disposed so as to overlap the resonator 20 when viewed in a plan view of the oscillator 1, and thus a region overlapping the resonator 20 is also effectively used. As a result, an increase in the size of the area of the integrated circuit element 10 is reduced, and the miniaturization of the oscillator 1 is realized. Meanwhile, the entirety of the low-pass filters 143 and 153 may overlap the metal members (the lid 24 and the excitation electrodes 21*a* and 21*b*) included in the resonator 20 when viewed in a plan view of the oscillator 1.

1-4. Operational Effects

As described above, in this exemplary embodiment, since the metal members (the lid 24 and the excitation electrodes 21*a* and 21*b*) included in the resonator 20 do not overlap the inductors 32 and 33 and the guard ring 50 which are included in each of the PLL circuits 14 and 15 when viewed in a plan view of the oscillator 1, a magnetic field generated due to a current flowing into the inductors 32 and 33 is hardly blocked by the metal members included in the resonator 20, and an eddy current is hardly generated inside the metal members. Therefore, according to the oscillator 1 of this exemplary embodiment, the deterioration of Q values of the inductors 32 and 33 is reduced, and a concern that a function as a circuit element is deteriorated is reduced.

In addition, according to this exemplary embodiment, the low-pass filters 143 and 153 hardly influenced by the metal members included in the resonator 20 are disposed so as to overlap the resonator 20 when viewed in a plan view of the oscillator 1, so that a region overlapping the resonator 20 is also effectively used and the miniaturization of the oscillator 1 is realized.

Further, in this exemplary embodiment, an output signal of the oscillation circuit 11 propagates to the PLL circuits 14 and 15, and an oscillation signal output from the PLL circuits 14 and 15 propagates to the output circuits 16 to 19. That is, a signal input to the integrated circuit element 10 from the electrode 26*a* of the resonator 20 through a pad functioning as an XG terminal propagates toward the side 10*c* from the side 10*a*, and is output through pads functioning as the OUT1 to OUT4 terminals or the OUT1B to OUT4B terminals. In this exemplary embodiment, the PLL circuits 14 and 15 are disposed between the oscillation circuit 11 and the output circuit 16 to 17 so as to be matched to flows of such various signals in the integrated circuit element 10, and thus wirings through which the various signals propagate are shortened. Therefore, according to the oscillator 1 of this exemplary embodiment, parasitic capacitance of each wiring is reduced, and noise superimposed on each signal due to crosstalk with other signals or the like is reduced. Further, since each wiring becomes short, a wiring region is reduced as a whole, and the area of the integrated circuit element 10 is reduced.

In addition, according to this exemplary embodiment, it is possible to connect the electrodes 26*a* and 26*c* provided on the outer surface of the base 23 of the resonator 20 and the pad functioning as the XG terminal provided in the integrated circuit element 10 and the pad functioning as the XD terminal through wire bonding, and thus it is easy to mount the oscillator 1. In addition, according to the oscillator 1 of this exemplary embodiment, a bonding wire can be lowered by the electrode 26*c* extending between the electrode 26*a* and the electrode 26*b*, and thus a concern that a portion of the bonding wire is exposed to the outside of the mold resin 4 is reduced in a sealing process of the resonator 20 and the integrated circuit element 10. Further, in the oscillator 1 of this exemplary embodiment, since four electrodes 26*a* to 26*d* are provided at four corners in the resonator 20, it is possible to share a manufacturing device and an inspection device, and demands for compatibility are met. In addition, since the electrode 26*c* extends between the electrode 26*a* and the electrode 26*b*, it is possible to distinguish the resonator 20 from other resonators by appearance.

1-5. Modification Example

For example, in the oscillator 1 of the above-described exemplary embodiment, the integrated circuit element 10 includes two PLL circuits each including an inductor. However, the integrated circuit element may include one PLL circuit or three or more PLL circuits, and the inductors may be disposed so as not to overlap the metal members included in the resonator 20 when viewed in a plan view of the oscillator 1.

In addition, for example, in the oscillator 1 of the above-described exemplary embodiment, the inductors 32 and 33 constitute a portion of the voltage controlled oscillators 144 and 154 (LC oscillator) in the PLL circuits 14 and 15 of the integrated circuit element 10. However, the inductors may constitute portions of an LC filter and an LR filter in the PLL circuit, and the inductors may be disposed so as not to overlap the metal members included in the resonator 20 when viewed in a plan view of the oscillator 1.

Further, for example, in the oscillator 1 of the above-described exemplary embodiment, the resonator 20 is configured such that the lid 24 is a metal member, but the resonator 20 may not include the lid 24 which is a metal member. For example, the oscillator 1 may be an oscillator having a structure in which a resonator element is accommodated by a base made of silicon and a lid (cap) made of glass, an oscillator having a structure in which a resonator element is accommodated by a base and a lid which are made of quartz crystal, or the like. Also in the oscillator 1 having these structures, the inductors included in the integrated circuit element 10 are disposed, for example, so as not to overlap the electrodes provided in the resonator element 21, and thus the deterioration of Q values of the inductors is reduced.

Further, for example, in the oscillator 1 of the above-described exemplary embodiment, the metal members (the lid 24 and the excitation electrodes 21a and 21b of the resonator element 21) included in the resonator 20 do not overlap the inductors. However, a lid, electrodes of a resonator element, and the like which are constituted by a conductive member other than a metal may be configured not to overlap the inductors. In a case of a conductive member, an eddy current may be generated, but an eddy current is hardly generated inside the conductive member by preventing overlapping with the inductors, thereby reducing the deterioration of Q values of the inductors.

Meanwhile, in the oscillator 1 of the above-described exemplary embodiment, both the inductors 32 and 33 included in the integrated circuit element 10 are disposed so as not to overlap the metal members included in the resonator 20, but not all of the inductors included in the integrated circuit element 10 are necessarily disposed so as not to overlap the metal members. For example, in a case where the integrated circuit element 10 includes an LC oscillator and a filter, a higher Q value is required for an inductor included in the LC oscillator. Thus, a configuration in which the inductor is disposed so as not to overlap the metal members and an inductor included in the filter is disposed so as to overlap the metal members from the viewpoint of miniaturization may be adopted.

2. Electronic Apparatus

Figure 7:
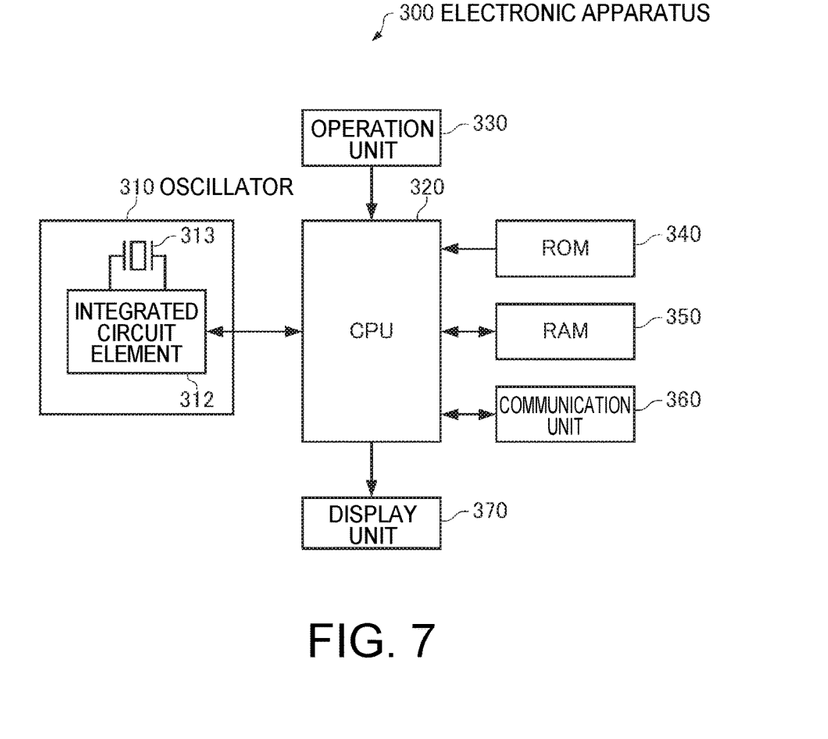
FIG. 7 is a functional block diagram of an electronic apparatus of this exemplary embodiment.
Figure 8:
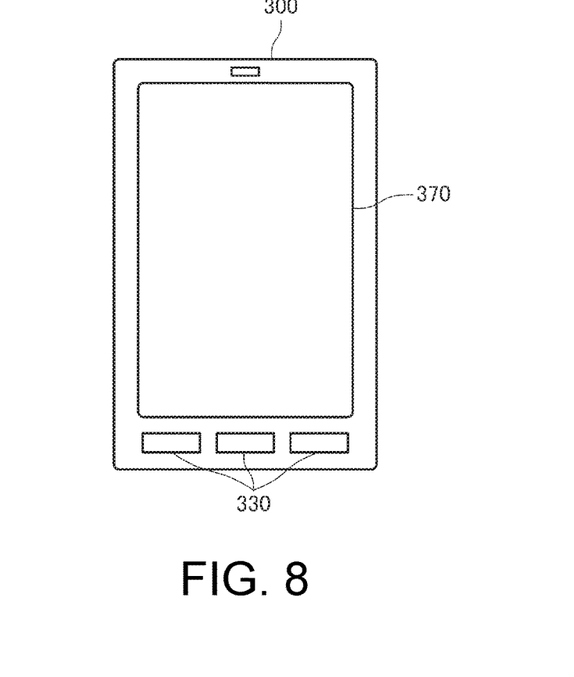
FIG. 8 is a diagram illustrating an example of the appearance of the electronic apparatus of this exemplary embodiment.

FIG. 7 is a functional block diagram illustrating an example of a configuration of an electronic apparatus of this exemplary embodiment. In addition, FIG. 8 is a diagram illustrating an example of the appearance of a smartphone which is an example of the electronic apparatus of this exemplary embodiment.

An electronic apparatus 300 of this exemplary embodiment is configured to include an oscillator 310, a Central Processing Unit (CPU) 320, an operation unit 330, a Read Only Memory (ROM) 340, a Random Access Memory (RAM) 350, a communication unit 360, and a display unit 370. Meanwhile, the electronic apparatus of this exemplary embodiment may be configured such that some of the components (units) illustrated in FIG. 7 are omitted or changed, or other components are added thereto.

The oscillator 310 includes an integrated circuit element 312 and a resonator 313. The integrated circuit element 312 oscillates the resonator 313 to generate an oscillation signal. The oscillation signal is output from an external terminal of the oscillator 310 to the CPU 320. The integrated circuit element 312 includes a PLL circuit not shown in the drawing, converts the frequency of the oscillation signal output from the resonator 313 by the PLL circuit, and outputs an oscillation signal having a frequency based on setting from the CPU 320.

The CPU 320 (processing unit) is a processing unit that performs various calculation processes and control processes by using the oscillation signal input from the oscillator 310 as a clock signal in accordance with programs stored in the ROM 340 and the like. Specifically, the CPU 320 performs various processes according to an operation signal from the operation unit 330, a process of controlling the communication unit 360 in order to perform data communication with an external device, a process of transmitting display signals for displaying various pieces of information on the display unit 370, and the like.

The operation unit 330 is an input device constituted by operation keys, button switches, and the like, and outputs an operation signal according to a user's operation to the CPU 320.

The ROM 340 is a storage unit that stores programs, data, and the like for performing various calculation processes and control processes by the CPU 320.

The RAM 350 is a storage unit which is used as a work area of the CPU 320, and temporarily stores programs and data read out from the ROM 340, data input from the operation unit 330, results of computation executed by the CPU 320 in accordance with various programs, and the like.

The communication unit 360 performs various control processes for establishing data communication between the CPU 320 and an external device.

The display unit 370 is a display device constituted by a Liquid Crystal Display (LCD) and the like, and displays various pieces of information on the basis of display signals input from the CPU 320. A touch panel functioning as the operation unit 330 may be provided in the display unit 370.

By applying, for example, the oscillator 1 of the above-described exemplary embodiment as the oscillator 310, it is possible to reduce a concern that a function as a circuit element is deteriorated due to the deterioration of a Q value of the inductor built into the integrated circuit element 312, and thus it is possible to implement the electronic apparatus with high reliability.

Various electronic apparatuses are conceived as the electronic apparatus 300, and may be, for example, a personal computer (for example, a mobile type personal computer, a laptop type personal computer, and a tablet type personal computer), a mobile terminal such as a smartphone or a mobile phone, a digital camera, an ink jet type ejection device (for example, an ink jet printer), a storage area network apparatus such as a router or a switch, a local area network apparatus, a mobile terminal base station apparatus, a television, a video camera, a video recorder, a car navigation device, a real-time clock device, a pager, an electronic organizer (including a communication function), an electronic dictionary, an electronic calculator, an electronic gaming machine, a gaming controller, a word processor, a workstation, a videophone, a security television monitor, electronic binoculars, a point of sale (POS) terminal, a medical apparatus (for example, an electronic thermometer, a sphygmomanometer, a blood glucose monitoring system, an electrocardiographic apparatus, an ultrasonic diagnostic apparatus, or an electronic endoscope), a fish-finder, various measurement apparatuses, meters and gauges (for example, meters and gauges of vehicles, aircrafts, and ships), a flight simulator, a head mounted display, a motion tracer, a motion tracker, a motion controller, a pedestrian dead reckoning (PDR) apparatus, and the like.

As an example of the electronic apparatus 300 of this exemplary embodiment, a transmission device functioning as a terminal base station apparatus communicating with, for example, a terminal in a wired or wireless manner, or the like by using the above-described oscillator 310 as a reference signal source is used. By applying, for example, the oscillator 1 of the above-described exemplary embodiment as the oscillator 310, and thus it is also possible to implement the electronic apparatus 300 which is usable in, for example, a communication base station and the like and is desired to have high frequency accuracy, high performance, and high reliability at lower costs than in the related art.

In addition, another example of the electronic apparatus 300 of this exemplary embodiment may be a communication device including a frequency control unit in which the communication unit 360 receives an external clock signal and the CPU 320 (processing unit) controls the frequency of the oscillator 310 on the basis of the external clock signal and an output signal (internal clock signal) of the oscillator 310. The communication device may be a communication apparatus which is used in a backbone network apparatus such as a stratum 3, or a femtocell.

3. Vehicle

Figure 9:
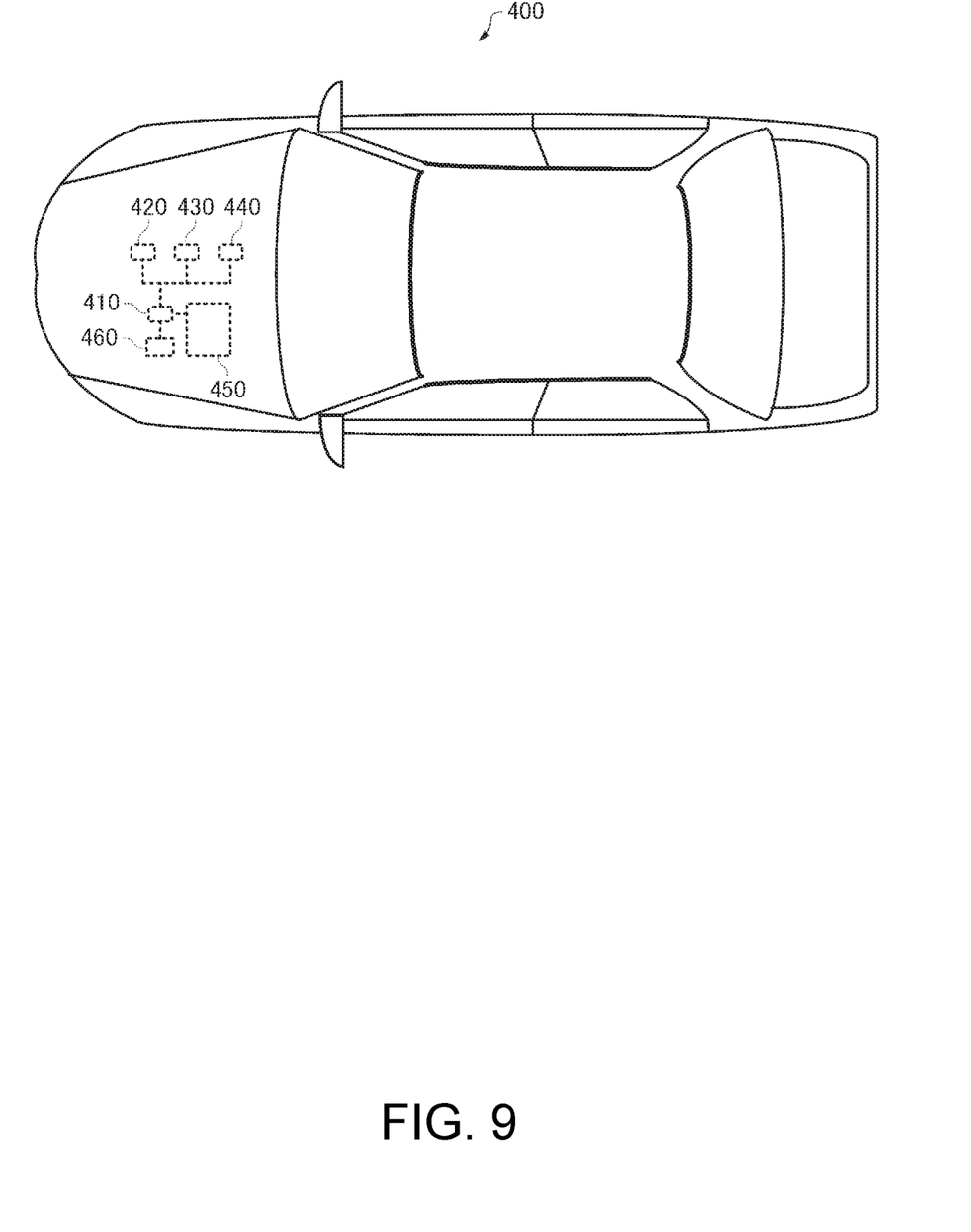
FIG. 9 is a diagram illustrating an example of a vehicle of this exemplary embodiment.

FIG. 9 is a diagram (top view) illustrating an example of a vehicle of this exemplary embodiment. A vehicle 400 illustrated in FIG. 9 is configured to include an oscillator 410, controllers 420, 430, and 440, such as an engine system, a brake system, and a keyless entry system, which perform various control processes, a battery 450, and a buffer battery 460. Meanwhile, the vehicle of this exemplary embodiment may be configured such that some of the components (units) illustrated in FIG. 9 are omitted or changed, or other components are added thereto.

The oscillator 410 includes an integrated circuit element and a resonator not shown in the drawing, and the integrated circuit element oscillates the resonator to generate an oscillation signal. The oscillation signal is output to the CPU 320 from an external terminal of the oscillator 410. The integrated circuit element includes a PLL circuit not shown in the drawing, converts the frequency of the oscillation signal output from the resonator by the PLL circuit, and outputs an oscillation signal having a frequency based on setting. The oscillation signal is output to the controllers 420, 430, and 440 from the external terminal of the oscillator 410, and is used as, for example, a clock signal.

The battery 450 supplies power to the oscillator 410 and the controllers 420, 430, and 440. The buffer battery 460 supplies power to the oscillator 410 and the controllers 420, 430, and 440 when an output voltage of the battery 450 falls below a threshold value.

By applying, for example, the oscillator 1 of the above-described exemplary embodiment as the oscillator 410, it is possible to reduce a concern that a function as a circuit element is deteriorated due to the deterioration of a Q value of an inductor built into the integrated circuit element of the oscillator 410, and thus it is possible to implement the vehicle with high reliability.

Various vehicles are conceived as the vehicle 400, and may be, for example, an automobile (also including an electric car), an aircraft such as a jet plane or a helicopter, a ship, a rocket, an artificial satellite, and the like.

The invention is not limited to this exemplary embodiment, various modifications can be made without departing from the scope of the invention.

The above-described exemplary embodiment and modification example are just examples, and the invention is not limited thereto. For example, the exemplary embodiment and the modification example may also be appropriately combined with each other.

The invention includes substantially the same configurations (for example, configurations having the same functions, methods and results, or configurations having the same objects and effects) as the configurations described in the exemplary embodiment. In addition, the invention includes a configuration obtained by replacing non-essential portions in the configurations described in the exemplary embodiment. In addition, the invention includes a configuration that exhibits the same operational effects as those of the configurations described in the exemplary embodiment or a configuration capable of achieving the same objects. In addition, the invention includes a configuration obtained by adding the configurations described in the exemplary embodiment to known techniques.

What is claimed is:

1. An oscillator comprising:
   a resonator which includes a resonator element and a resonator element container accommodating the resonator element; and
   an integrated circuit element which includes an inductor,
   wherein the resonator and the integrated circuit element are stacked on each other,
   the resonator includes a conductive member,
   the conductive member does not overlap the inductor when viewed in a plan view,
   the integrated circuit element further includes a guard ring provided in a vicinity of the inductor, and
   the conductive member does not overlap the guard ring when viewed in the plan view.

2. The oscillator according to claim 1, wherein
   the integrated circuit element includes a PLL circuit including the inductor and a filter, and
   the filter overlaps the conductive member when viewed in the plan view.

3. A vehicle comprising the oscillator according to claim 2.

4. An electronic apparatus comprising the oscillator according to claim 2.

5. The oscillator according to claim 2, wherein
   the integrated circuit element includes
      an oscillation circuit which is connected to the resonator, and
      an output circuit which outputs a signal based on an oscillation signal output from the PLL circuit,
   the oscillation signal is phase-synchronized with an output signal of the oscillation circuit, and
   the PLL circuit is disposed between the oscillation circuit and the output circuit when viewed in the plan view.

6. An electronic apparatus comprising the oscillator according to claim 5.

7. A vehicle comprising the oscillator according to claim 5.

8. The oscillator according to claim 5, wherein
   the integrated circuit element includes
      a first pad which is electrically connected to one end of the resonator,
      a second pad which is electrically connected to the other end of the resonator, and
      a third pad which is electrically connected to the output circuit,
   the first pad and the second pad are provided along a first side of the integrated circuit element, and
   the third pad is provided along a second side opposite the first side of the integrated circuit element.

9. A vehicle comprising the oscillator according to claim 8.

10. An electronic apparatus comprising the oscillator according to claim 8.

11. The oscillator according to claim 1, wherein
    the resonator element container includes
       a base which is provided with a concave portion accommodating the resonator element, and
       a lid which is the conductive member, and
    the resonator is mounted on the integrated circuit element so that the lid faces the integrated circuit element.

12. An electronic apparatus comprising the oscillator according to claim 11.

13. The oscillator according to claim 1, wherein the conductive member is an electrode provided in the resonator element.

14. The oscillator according to claim 1, wherein
a first electrode, a second electrode, a third electrode, and a fourth electrode are provided at four corners on an outer surface of the resonator element container,
the first electrode and the third electrode are provided at two corners on a diagonal of the outer surface,
the second electrode and the fourth electrode are provided at the other two corners on a diagonal of the outer surface, and
the third electrode extends between the first electrode and the second electrode.

15. An electronic apparatus comprising the oscillator according to claim 1.

16. A vehicle comprising the oscillator according to claim 1.

17. The oscillator according to claim 1, wherein the conductive member is a metal member.

18. An oscillator comprising:
a resonator which includes a resonator element and a resonator element container accommodating the resonator element; and
an integrated circuit element,
wherein the resonator and the integrated circuit element are stacked on each other,
the integrated circuit element includes
an oscillation circuit which is connected to the resonator,
a first PLL circuit which includes a first inductor, and
a second PLL circuit which includes a second inductor,
a first oscillation signal output from the first PLL circuit and a second oscillation signal output from the second PLL circuit are phase-synchronized with an output signal of the oscillation circuit,
the resonator includes a conductive member, and
the conductive member does not overlap the first inductor and the second inductor when viewed in a plan view.

19. The oscillator according to claim 18, wherein the conductive member is a metal member.

20. An oscillator comprising:
a resonator which includes a conductive member; and
an integrated circuit element which includes an inductor,
wherein the resonator and the integrated circuit element are stacked on each other in a stacking direction,
the conductive member does not overlap the inductor when viewed along the stacking direction,
the integrated circuit element further includes a guard ring provided in a vicinity of the inductor, and
the conductive member does not overlap the guard ring when viewed along the stacking direction.

* * * * *